(12) United States Patent
Dvorak et al.

(10) Patent No.: US 6,522,210 B1
(45) Date of Patent: Feb. 18, 2003

(54) RANDOM PULSE GENERATOR

(75) Inventors: Mark Daniel Dvorak, Waseca, MN (US); Paul Eugene Bauhahn, Fridley, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/505,274

(22) Filed: Feb. 16, 2000

(51) Int. Cl.$^7$ .............................................. H03B 29/00
(52) U.S. Cl. ............................ 331/78; 331/46; 331/47; 708/250; 708/251
(58) Field of Search ............................ 331/78, 46, 47; 708/255, 250, 251; 327/114

(56) References Cited

U.S. PATENT DOCUMENTS

| | | | |
|---|---|---|---|
| 3,612,845 A | * 10/1971 | Lawlor | 331/78 |
| 4,001,716 A | * 1/1977 | Swanson et al. | 331/48 |
| 4,318,008 A | * 3/1982 | Nall | 331/47 X |
| 4,769,777 A | 9/1988 | Bittle et al. | 364/717 |
| 4,817,145 A | 3/1989 | Gunther | |
| 5,097,180 A | * 3/1992 | Ignon et al. | 315/200 A |
| 5,841,680 A | 11/1998 | Lightfoot | |

FOREIGN PATENT DOCUMENTS

| | | |
|---|---|---|
| DE | 19618098 | 6/1997 |
| EP | 0146865 A | 7/1985 |

OTHER PUBLICATIONS

Patent Abstracts of Japan, vol. 1998, No. 06, Apr. 30, 1998 & JP 10 051276 A (Oki Electric Ind Co Ltd), Feb. 20, 1998 Abstract.

* cited by examiner

*Primary Examiner*—Arnold Kinkead
(74) *Attorney, Agent, or Firm*—Dennis C. Bremer

(57) ABSTRACT

Random pulse generators and generating systems using at least three oscillators. The output signals of at least two of the oscillators are combined to disturb the output signal of a final oscillator. For one configuration, combined output signals of at least two phase shift oscillators are used to modify the feedback signal of a final phase shift oscillator, thus disturbing the output signal of the final oscillator. For another configuration, the output signals of at least two phase shift oscillators are used to drive a subtractor whose output signal is combined with the output signal of a final phase shift oscillator to drive a subsequent subtractor, thus disturbing the output signal of the final oscillator.

36 Claims, 9 Drawing Sheets

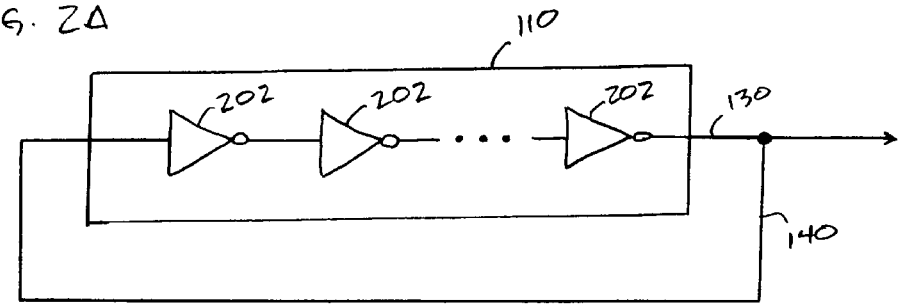
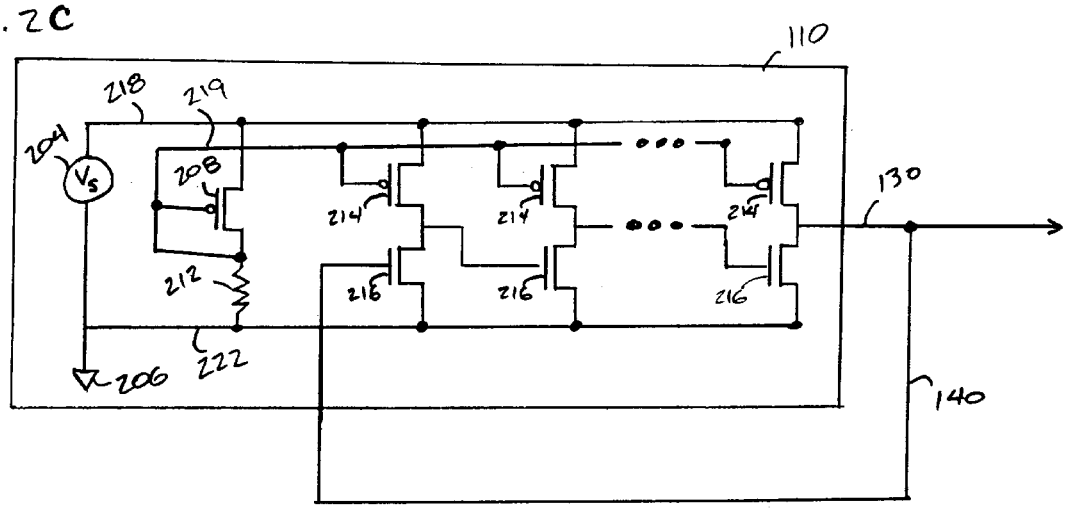
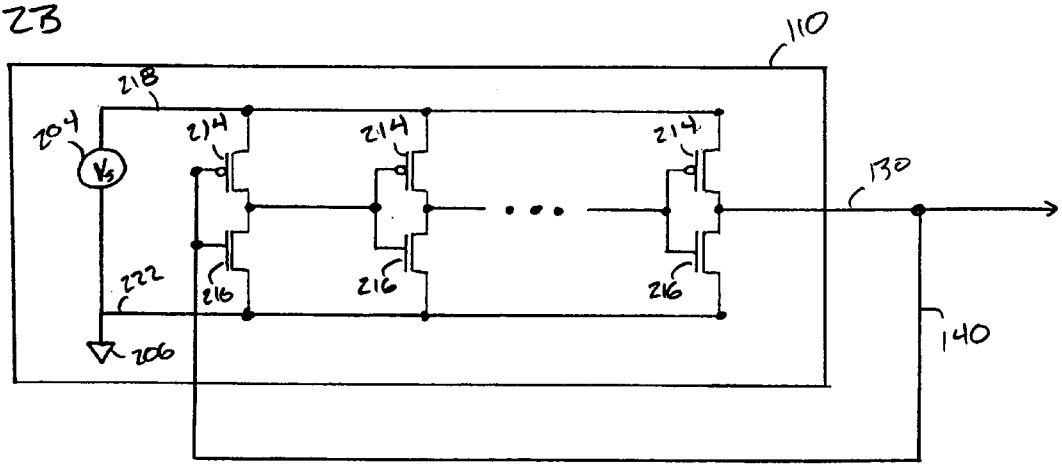

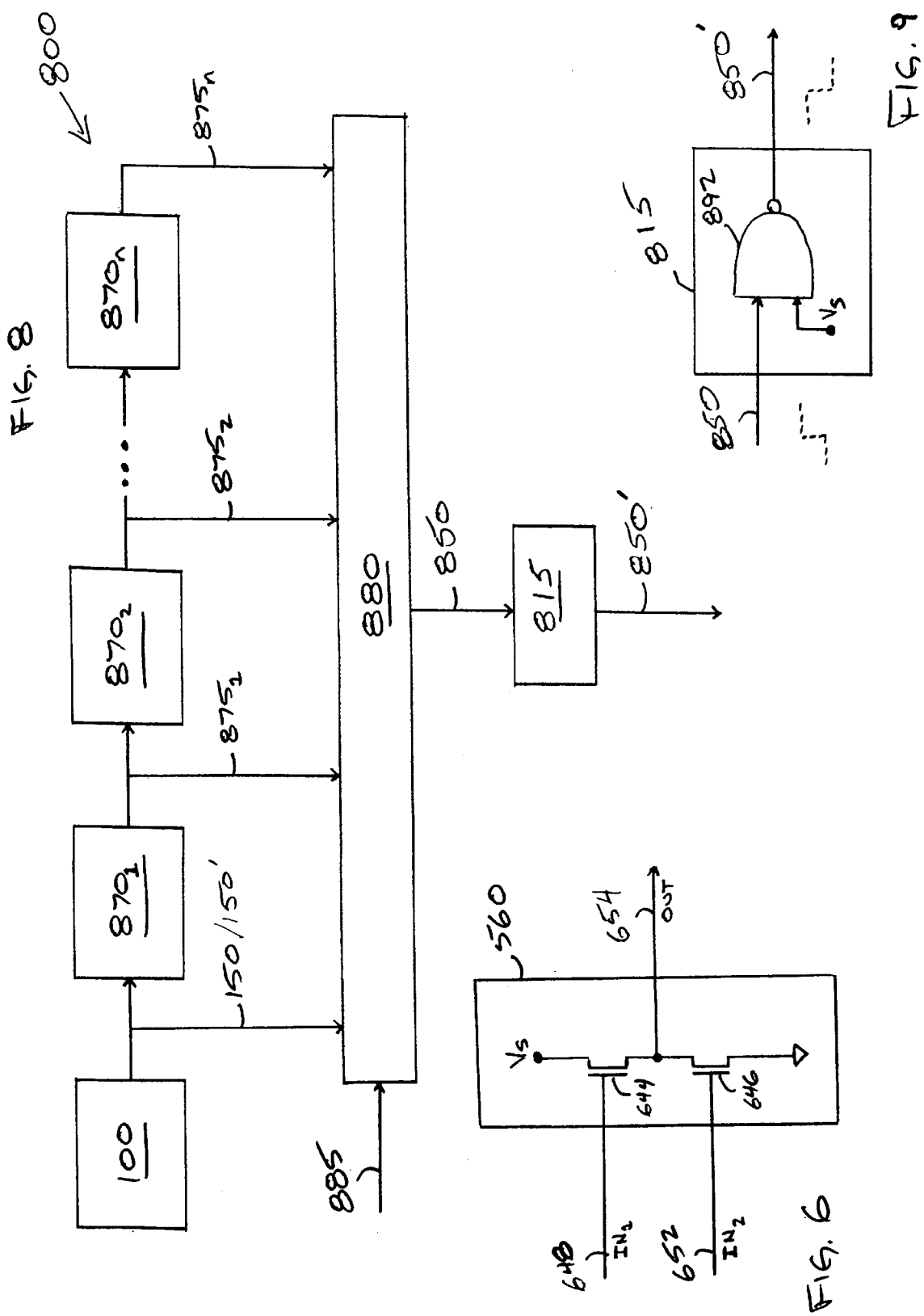

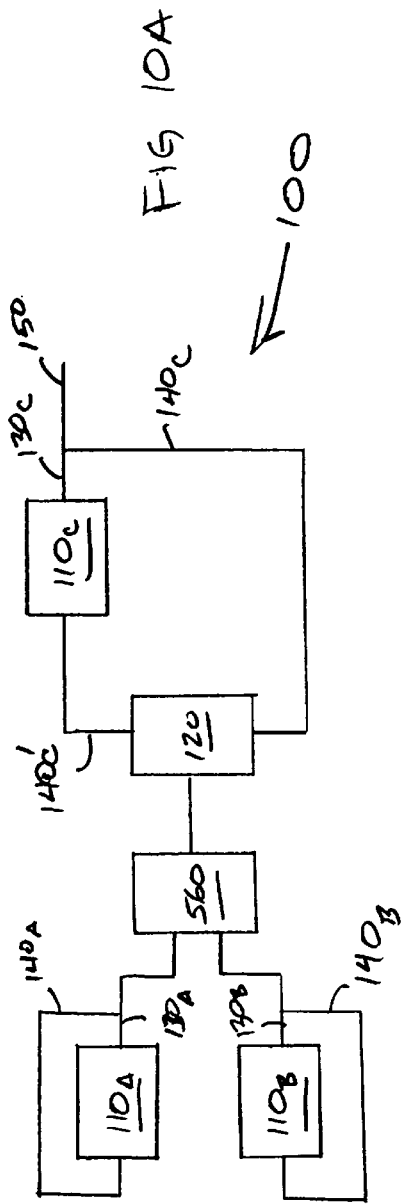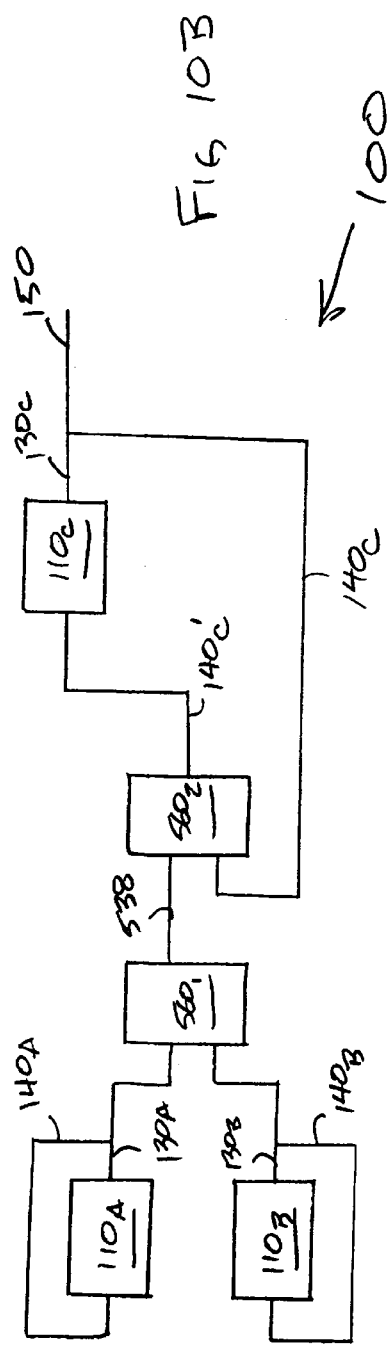

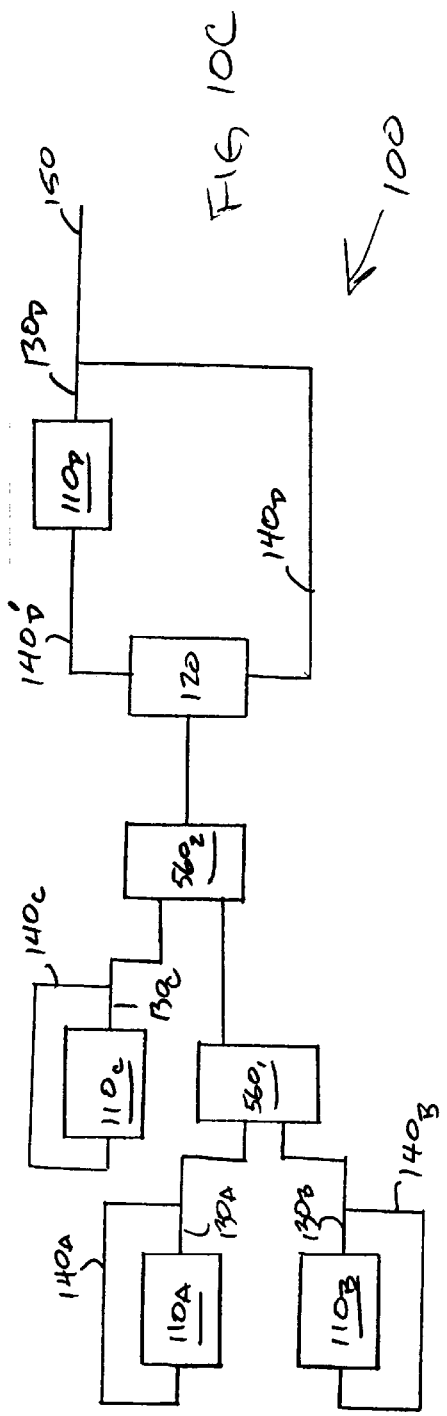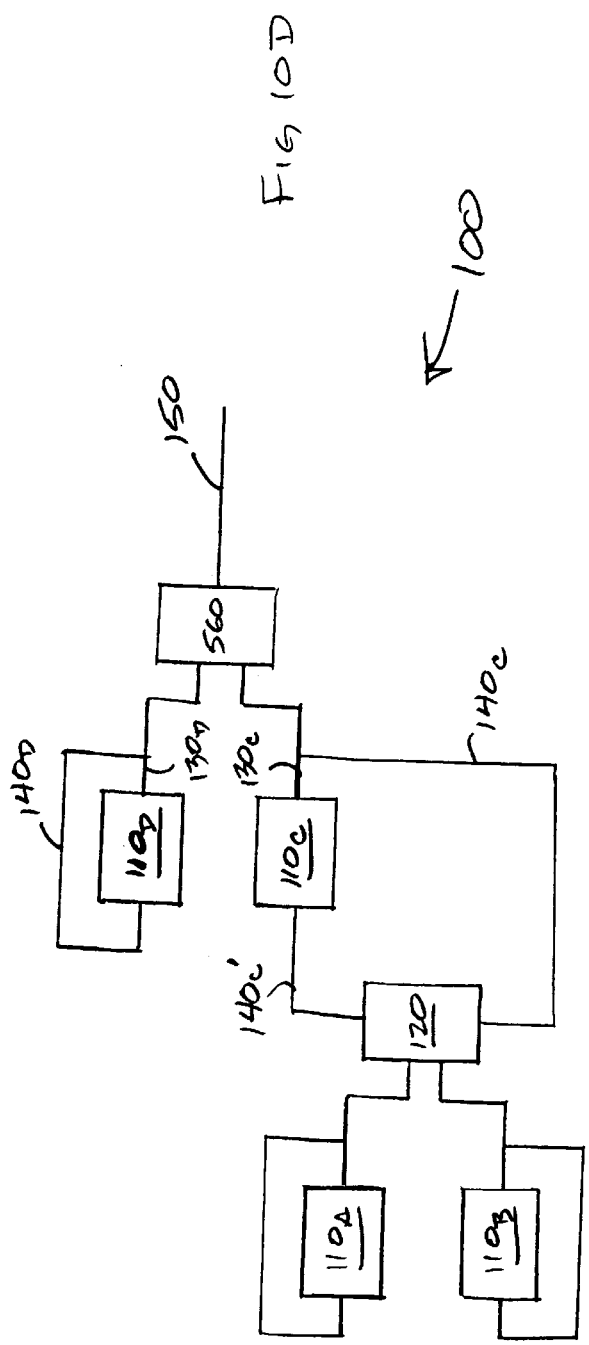

RANDOM PULSE GENERATOR

The present invention was produced in conjunction with research for the Office of Naval Research under Contract No. N00014-98-3-0020. The United States Government has certain rights to the invention.

TECHNICAL FIELD

The present invention relates generally to the generation of randomized pulses, and in particular to a random pulse generator having at least three oscillators, wherein the outputs of at least two of the oscillators are combined to disturb the output of a final oscillator.

BACKGROUND

On-off waveforms with random transition times, i.e., random pulse trains, have found use in a variety of applications. One such class of applications is that of ultra-wide bandwidth radar and other radar-type applications. Random pulse trains can be used to generate electromagnetic impulses at random intervals, thus greatly reducing susceptibility of detection and/or jamming of the radar system by other electronic systems.

Commonly, pseudo-random pulse trains are generated using a linear feedback shift register (LFSR) as the pulse generator. While use of such pulse generators offers some protection from detection and jamming, the resulting pseudo-random pulse trains generally repeat at some regular interval. This periodicity of the pulse train increases the likelihood of detection and jamming of the radar system.

Attempts to improve the randomness of pulse generators have been described. See, e.g., U.S. Pat. No. 4,769,777 issued to Bittle et al. on Sep. 6, 1988 (Bittle et al.). Bittle et al. is fundamentally based on an LFSR, using a phase shift oscillator whose supply voltage is varied in time to interfere with the periodicity of the LFSR by altering the frequency of oscillation of the phase shift oscillator. Devices of Bittle et al. may also use variable thermal feedback to vary the frequency of the oscillator. However, for miniaturized applications, e.g., incorporating a relatively high rate random pulse generator on an integrated circuit device, thermal feedback may not be desirable or practicable for interfering with periodicity. Furthermore, as integrated circuits continue to operate on lower supply voltages, variation of supply voltage may also be impracticable as a means of interfering with periodicity.

For the reasons stated above, and for other reasons stated below which will become apparent to those skilled in the art upon reading and understanding the present specification, there is a need in the art for alternate methods of generating random pulse trains.

SUMMARY

The above-mentioned problems with random pulse generation and other problems are addressed by the present invention and which will be understood by reading and studying the following specification. Random pulse generators and systems are described herein using at least three oscillators, wherein the output signals of at least two of the oscillators are combined to disturb the output signal of a final oscillator. The final oscillator refers to the oscillator immediately preceding production of the random pulse train. For one configuration, combined output signals of at least two phase shift oscillators are used to modify the feedback signal of a final phase shift oscillator, thus disturbing the output signal of the final oscillator. For another configuration, the output signals of at least two phase shift oscillators are used to drive a subtractor whose output signal is combined with the output signal of a final phase shift oscillator to drive a subsequent subtractor, thus disturbing the output signal of the final oscillator. It is generally preferred that each oscillator have a different period. While pulse generators described herein are capable of exhibiting substantially random behavior and are referred to as random pulse generators, it is recognized that true random behavior is likely unattainable in electronic systems. However, systems designed in accordance with various embodiments of the invention are capable of sufficiently approximating random behavior to find use in applications such as those described above.

For one embodiment, the invention provides a random pulse generator. The random pulse generator includes a first oscillator having an output signal, a second oscillator having an output signal, and a third oscillator having an output signal. The output signal of the first oscillator and the output signal of the second oscillator are combined to disturb the output signal of the third oscillator.

For another embodiment, the invention provides a random pulse generator. The random pulse generator includes a first phase shift oscillator having an output signal and a feedback signal and comprising a first odd number of inverter segments, a second phase shift oscillator having an output signal and a feedback signal and comprising a second odd number of inverter segments, and a third phase shift oscillator having an output signal and a feedback signal and comprising a third odd number of inverter segments. The random pulse generator further includes a filter comprising a resistive component and having a first input of the output signal of the first phase shift oscillator, a second input of the output signal of the second phase shift oscillator, and a third input of the feedback signal of the third phase shift oscillator. The output signal of the first phase shift oscillator and the output signal of the second phase shift oscillator vary a resistance of the resistive component of the filter and the feedback signal of the third phase shift oscillator is coupled to the resistive component of the filter and is modified by varying the resistance of the resistive component of the filter.

For yet another embodiment, the invention provides a random pulse generator. The random pulse generator includes a first phase shift oscillator having an output signal and a feedback signal and comprising a first odd number of inverter segments, a second phase shift oscillator having an output signal and a feedback signal and comprising a second odd number of inverter segments, and a third phase shift oscillator having an output signal and a feedback signal and comprising a third odd number of inverter segments. The random pulse generator further includes a first subtractor coupled to the output signals of the first and second phase shift oscillators, wherein the first subtractor produces a first intermediate potential in response to the output signals of the first and second phase shift oscillators. The random pulse generator further includes a second subtractor coupled to the first intermediate potential and the output signal of the third phase shift oscillator, wherein the second subtractor produces a second intermediate potential in response to the first intermediate potential and the output signal of the third phase shift oscillator.

For a further embodiment, the invention provides a random pulse generator. The random pulse generator includes a plurality of first phase shift oscillators having a combined output signal, a second phase shift oscillator having an output signal and a feedback signal, and a third phase shift oscillator having an output signal and a feedback signal. The random pulse generator further includes a first subtractor coupled to the combined output signal of the plurality of first phase shift oscillators and the output signal of the second phase shift oscillator, wherein the first subtractor produces a first intermediate potential in response to the combined output signal of the plurality of first phase shift oscillators and the output signal of the second phase shift oscillator. The random pulse generator still further includes a second subtractor coupled to the first intermediate potential and the output signal of the third phase shift oscillator, wherein the second subtractor produces a second intermediate potential in response to the first intermediate potential and the output signal of the third phase shift oscillator.

For another embodiment, the invention provides a random pulse generating system. The random pulse generating system includes a random pulse generator having a random pulse train and at least one frequency divider each having an input signal and an output signal. The at least one frequency divider is coupled to the random pulse generator in series. The first frequency divider in the series has the random pulse train as its input signal, and each succeeding frequency divider in the series has the output signal of the preceding frequency divider as its input signal. The random pulse generating system further includes a multiplexor coupled to the random pulse train and the output signals of the at least one frequency divider as parallel inputs, wherein the multiplexor is responsive to a control signal to select one of the parallel inputs as a selected output.

For still another embodiment, the invention provides a method of generating a random pulse train. The method includes producing a first output signal from a first oscillator, producing a second output signal from a second oscillator, and combining the first output signal and the second output signal to disturb an output signal of a third oscillator.

For yet another embodiment, the invention provides a method of generating a random pulse train. The method includes producing a first output signal from a first oscillator, producing a second output signal from a second oscillator, and varying a resistance in response to the first and second output signals. The method further includes modifying a feedback signal of a third oscillator in response to the resistance, thereby disturbing an output signal from the third oscillator, and conditioning the output signal from the third oscillator to substantially remove partial peaks from the output signal from the third oscillator. Substantially removing partial peaks refers to a conditioning of the signal to produce faster and more complete transitions between the rail potentials.

For a still further embodiment, the invention provides a method of generating a random pulse train. The method includes producing a first output signal from a first oscillator, producing a second output signal from a second oscillator and producing a first intermediate potential in response to the first output signal and the second output signal. The method further includes producing a second intermediate potential in response to the output signal of the third oscillator and the first intermediate potential, producing a third intermediate potential in response to the second intermediate potential and a reference voltage, and conditioning the third intermediate potential to substantially remove partial peaks from the third intermediate potential.

The invention further provides methods of pulse generation and pulse generating apparatus of varying scope.

BRIEF DESCRIPTION OF THE DRAWINGS

FIG. 2A is a symbolic schematic of one oscillator for use in a random pulse generator of FIG. 1 or 5.

FIG. 2B is a schematic of another oscillator for use in a random pulse generator of FIG. 1 or 5.

FIG. 2C is a schematic of another oscillator for use in a random pulse generator of FIG. 1 or 5.

FIG. 6 is a schematic of a subtractor for use with a random pulse generator of FIG. 5.

FIG. 8 is a block diagram of a random pulse generating system containing a tuning circuit for adjusting the average transition rate of the output of a random pulse generator of FIG. 1 or 5.

FIG. 9 is a symbolic schematic of another signal conditioner for use with a random pulse generator of FIG. 1 or 5, or a random pulse generating system of FIG. 8.

FIGS. 10A–10D are block diagrams of various additional random pulse generators.

DESCRIPTION OF THE EMBODIMENTS

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The following detailed description is, therefore, not to be taken in a limiting sense, and the scope of the present invention is defined only by the appended claims and equivalents thereof.

Figure 1:
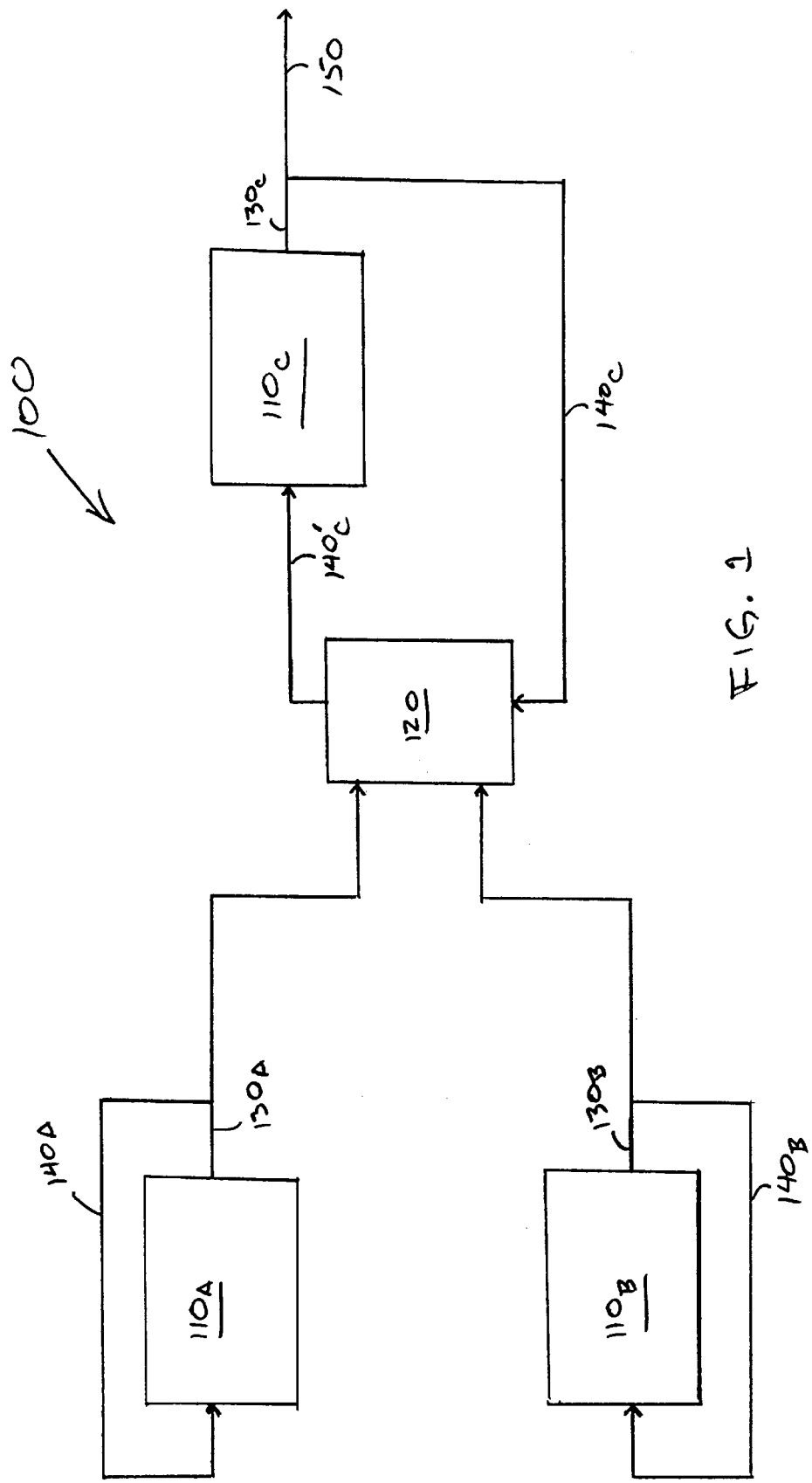
FIG. 1 is a block diagram of a random pulse generator.

FIG. 1 is a block diagram of one embodiment of a random pulse generator 100 in accordance with the invention. Random pulse generator 100 includes three oscillators $110_A$, $110_B$ and $110_C$. The three oscillators 110 each have an output signal 130 that oscillates between a logic high level and a logic low level. Left undisturbed, the output signal 130 of each oscillator 110 will generally oscillate between the logic high level and the logic low level at a regular frequency having a period equal to the propagation time of an input signal through the oscillator 110, in this case feedback signal 140.

To reduce the risk of coupling among the oscillators 110, it is preferred that each oscillator 110 have a different period.

It may further be desirable that each oscillator 110 have a period that is not a multiple of either of the other oscillators 110. However, neither of these guidelines is required. For one embodiment, the final oscillator 110$_C$ has the shortest period. As one example, oscillator 110$_A$ may have a period of 15t, oscillator 110$_B$ may have a period of 9t and oscillator 110$_C$ may have a period of 5t, where t is some measure of time.

Each oscillator 110 in FIG. 1 utilizes its output signal 130 as the feedback signal 140. The output signals 130$_A$ and 130$_B$ of oscillators 110$_A$ and 110$_B$, respectively, are coupled to filter 120. Filter 120, in response to oscillator output signals 130$_A$ and 130$_B$, filters or modifies oscillator feedback signal 140$_C$ to produce modified oscillator feedback signal 140$_C$'. As there is no inherent limitation in the number of oscillators coupled to filter 120, for one embodiment, filter 120 is coupled to additional oscillator output signals 130. By modifying the oscillator feedback signal 140$_C$, output signals 130$_A$ and 130$_B$ of oscillators 110$_A$ and 110$_B$, respectively, thus disturb the output signal 130$_C$ of the final oscillator 110$_C$. For one embodiment, filter 120 is a low-pass RC filter whose resistive component is proportional to the combined output signals 130 coupled to filter 120. Having disturbed the feedback signal 140$_C$, oscillator 110$_C$ produces an output signal 130$_C$ with a generally irregular transition rate. Output signal 130$_C$ of oscillator 110$_C$ becomes the random pulse train 150 of the random pulse generator 100. With no intervening oscillators between oscillator 110$_C$ and random pulse train 150, oscillator 110$_C$ is referred to as the final oscillator.

FIGS. 2A–2D are schematics of various embodiments of oscillators 110 for use with random pulse generators as described herein. In general, oscillators 110 produce a known output signal from a given input signal such that the output signal differs from the input signal. By utilizing the output signal 130 as a feedback signal 140, output signal 130 will tend to oscillate between logic levels and have a period of oscillation equal to the propagation delay of the oscillator if the feedback signal 140 is not subjected to external disturbance. Such oscillators are generally referred to as phase shift oscillators. One of the simplest phase shift oscillators is a logic inverter, producing a phase shift of 180° between the feedback signal 140 and the resulting output signal 130.

FIG. 2A is a symbolic schematic of a phase shift oscillator 110 including a series of inverter segments 202. To produce sustainable oscillation, the number of inverter segments 202 of oscillator 110 must be odd. While the minimum number of inverter segments 202 is one, there is no maximum number of inverter segments 202 inherent in the various embodiments. As can be seen from FIG. 2A, as feedback signal 140 propagates through oscillator 110, it will produce an output signal 130 having an opposite logic value. The pulse train of output signal 130 of FIG. 2A will generally approximate a square wave if the feedback signal 140 is left undisturbed. The propagation time, and thus the period of oscillation, may be lengthened by coupling additional inverter segments 202 in series.

FIG. 2B is a schematic of another phase shift oscillator 110. As shown in FIG. 2B, oscillator 110 includes a series of inverter segments. The number of inverter segments is odd. Each inverter segment includes a p-channel transistor 214 and an n-channel transistor 216. The source of each p-channel transistor 214 is coupled to a high rail 218 while the drain of each n-channel transistor 216 is coupled to a low rail 222. The high rail 218 is held at a first potential or logic level represented by V$_s$ from supply voltage 204 while the low rail 222 is held at a second potential or logic level represented by ground from ground node 206. While the following descriptions will use supply voltage Vs as the first potential and ground as the second potential, it is to be understood that other potentials can be chosen by the designer as the first and second potentials, and each oscillator can use different first and second potentials. As one example, a first oscillator 110 may use 3V as a logic high level and –1V as a logic low level, while a second oscillator 110 may use 1V as a logic high level and ground as a logic low level.

The gates of the transistors 214 and 216 of the first inverter segment are coupled to the feedback signal 140. The drain of each p-channel transistor 214 is coupled to the source of its associated n-channel transistor 216. This junction in turn supplies the logic input to the gates of the next inverter segment in the series. The pulse train of output signal 130 of FIG. 2B will generally approximate a square wave if feedback signal 140 is left undisturbed. As before, the period of oscillation may be modified by adjusting the number of inverter segments in the oscillator 110.

FIG. 2C is a schematic of another phase shift oscillator 110. As shown in FIG. 2C, oscillator 110 includes a series of inverter segments. The number of inverter segments is odd. Each inverter segment includes a p-channel transistor 214 and an n-channel transistor 216. The source of each p-channel transistor 214 is coupled to a high rail 218 while the drain of each n-channel transistor 216 is coupled to a low rail 222. The high rail 218 is held at a first potential or logic level represented by V$_s$ from supply voltage 204 while the low rail 222 is held at a second potential or logic level represented by ground from ground node 206.

The gates of p-channel transistors 214 are coupled to an intermediate rail 219. The voltage level of intermediate rail 219 is held at some value intermediate of the first potential and the second potential. The voltage level of intermediate rail 219 is controlled by coupling the intermediate rail 219 to the gate and drain of p-channel transistor 208. The source of p-channel transistor 208 is coupled to the high rail 218 and the drain of p-channel transistor 208 is further coupled to the low rail 222 with an interposing resistor 212. The resistance of resistor 212 should be adjusted such that the transconductance of each n-channel transistor 216 when logic high is applied to its gate exceeds the transconductance of its associated p-channel transistor 214 with the intermediate voltage applied to its gate. In this manner, the drain/source junction between each transistor pair will produce a logic high value when a logic low is applied to the gate of the n-channel transistor 216 and a logic low value when a logic high is applied to the gate of the n-channel transistor 216. The pulse train of output signal 130 of FIG. 2C will generally approximate a square wave if the feedback signal 140 is left undisturbed. As before, the period of oscillation may be modified by adjusting the number of inverter segments in the oscillator 110.

Figure 2D:
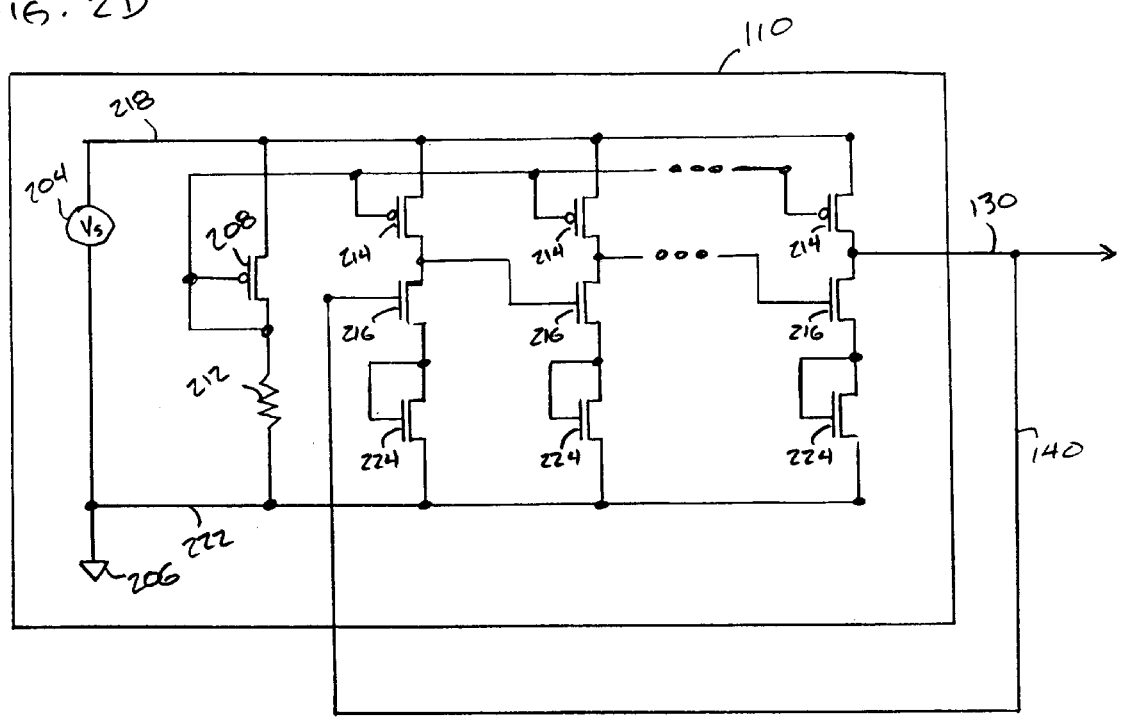
FIG. 2D is a schematic of another oscillator for use in a random pulse generator of FIG. 1 or 5.

FIG. 2D is a schematic of another oscillator 110 including a series of inverter segments. The oscillator 110 of FIG. 2D differs from the oscillator 110 of FIG. 2C by the addition of diode-connected n-channel transistors interposed between the drain of the n-channel transistors 216 and the low rail 222. The diode-connected n-channel transistors 224 limit the range of the output voltage. This has the effect of creating a waveform with transitions that are not as fast or as well defined as the waveform of the oscillator 110 of FIG. 2C. This effect can be used to improve the randomness of the resulting pulse train.

Figure 3:
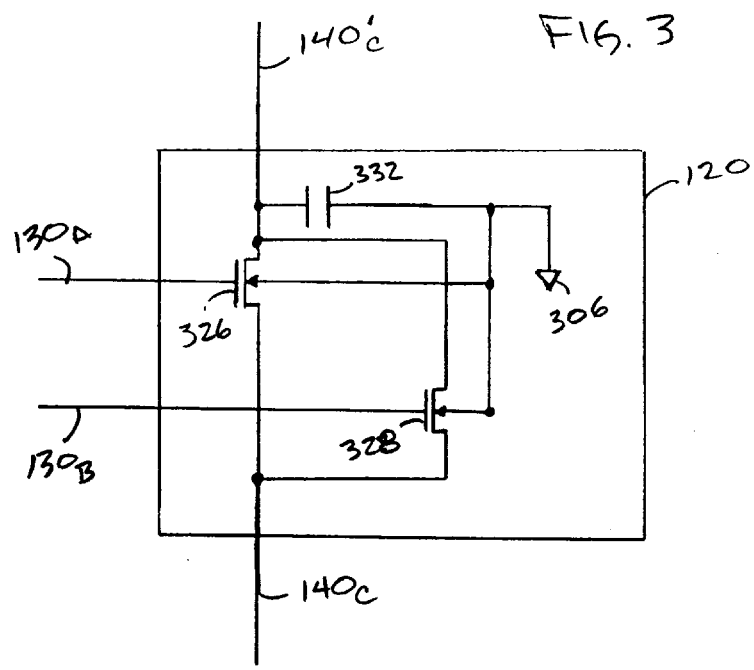
FIG. 3 is a schematic of a filter for use in a random pulse generator of FIG. 1.

FIG. 3 is a schematic of one embodiment of a filter 120 for use with a random pulse generator. As shown, filter 120 is a variable RC filter. The capacitive component is represented by capacitor 332, coupled between the modified oscillator feedback signal 140$_C$' and a ground node 306. The resistive component includes n-channel transistors 326 and 328 whose gates are coupled to the oscillator output signals 130$_A$ and 130$_B$, respectively. The n-channel transistors 326 and 328 are coupled between oscillator feedback signal 140$_C$ and modified oscillator feedback signal 140$_C$'. The variation of oscillator output signals 130$_A$ and 130$_B$ produce variable resistance across n-channel transistors 326 and 328, respectively, thus producing external disturbance of oscillator feedback signal 140$_C$. Filter 120 may further include any device adapted to disturb or modify the oscillator feedback signal 140$_C$ in response to one or more variable input signals, such as oscillator output signals 130$_A$ and 130$_B$.

Figure 4A:
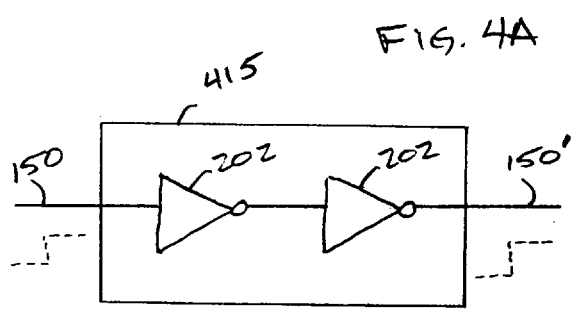
FIG. 4A is a symbolic schematic of a signal conditioner for use with a random pulse generator of FIG. 1 or 5, or a random pulse generating system of FIG. 8.
Figure 4B:
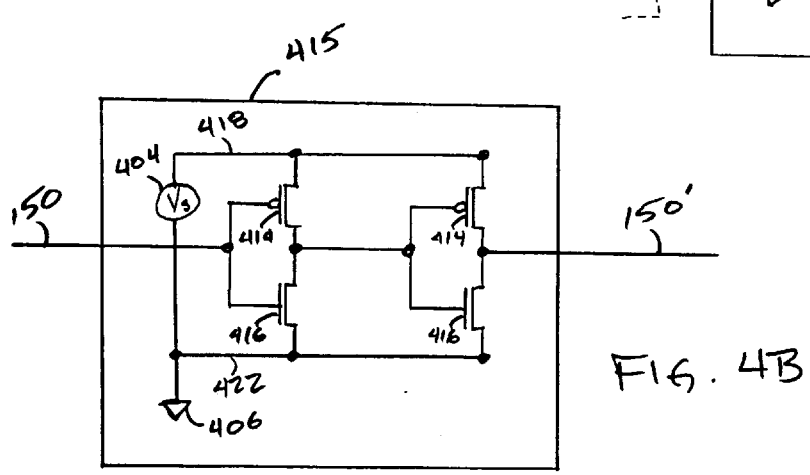
FIG. 4B is a schematic of another signal conditioner for use with a random pulse generator of FIG. 1 or 5, or a random pulse generating system of FIG. 8.
Figure 4C:
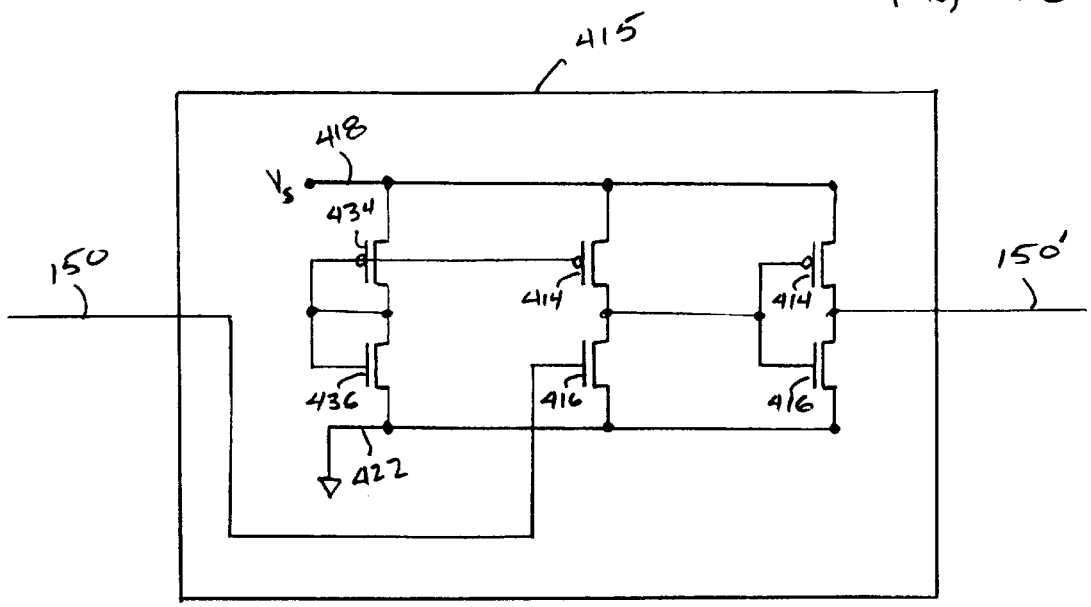
FIG. 4C is a schematic of another signal conditioner for use with a random pulse generator of FIG. 1 or 5, or a random pulse generating system of FIG. 8.

Because modified oscillator feedback signal 140$_C$' may assume values intermediate of logic high and logic low, the resulting oscillator output signal 130$_C$, and thus the random pulse train 150, may contain pulses having values other than logic high (high rail potential) and logic low (low rail potential). Pulses having values other than logic high and logic low appear as partial peaks or "runt" pulses in the random pulse train 150. It may be desirable to condition the random pulse train 150 to substantially remove such partial peaks. One method of conditioning the random pulse train 150 to remove partial peaks would be to subject the random pulse train 150 to a series of inverter segments. FIGS. 4A–4C depict various embodiments of signal conditioners 415 for use with random pulse generators as described herein.

FIG. 4A is a symbolic schematic of one signal conditioner 415 having a series of inverter segments 202. While the signal conditioner 415 of FIG. 4A is shown to have two inverter segments 202, any number of inverter segments 202 may be used. A random pulse train 150 applied as an input signal to signal conditioner 415 will produce a modified random pulse train 150'. Modified random pulse train 150' will tend to exhibit pulses having fast and more complete transitions between a logic high level and a logic low level, thus removing substantially all partial peaks.

FIG. 4B is a schematic of another signal conditioner 415 having a series of inverter segments. While the signal conditioner 415 is depicted having two inverter segments, any number of inverter segments could be used. Each inverter segment includes a p-channel transistor 414 and an n-channel transistor 416. The source of each p-channel transistor 214 is coupled to a high rail 418 while the drain of each n-channel transistor 416 is coupled to a low rail 422. The high rail 418 is held at a first potential or logic level represented by V$_s$ from supply voltage 404 while the low rail 422 is held at a second potential or logic level represented by ground from ground node 406.

The gates of the transistors 414 and 416 of the first inverter segment are coupled to the random pulse train 150. The drain of each p-channel transistor 414 is coupled to the source of its associated n-channel transistor 416. This junction in turn supplies the logic input to the gates of the next inverter segment in the series. The drain/source junction of the last inverter segment produces modified random pulse train 150'. Pulses of modified random pulse train 150' will tend to exhibit faster and more complete transitions between the rail potentials, thus removing substantially all partial peaks.

FIG. 4C is a schematic of another signal conditioner 415 having a series of inverter segments. While the signal conditioner 415 is depicted having two inverter segments, any number of inverter segments could be used. Each inverter segment includes a p-channel transistor 414 and an n-channel transistor 416. The source of each p-channel transistor 414 is coupled to a high rail 418 while the drain of each n-channel transistor 416 is coupled to a low rail 422. The high rail 418 is held at a first potential or logic level represented by V$_s$ while the low rail 422 is held at a second potential or logic level represented by ground.

The gate of the p-channel transistor 414 of the first inverter segment is coupled to the gate of another p-channel transistor 434. The gate of p-channel transistor 434 is further coupled to the drain of p-channel transistor 434, the source of n-channel transistor 436 and the gate of n-channel transistor 436. The source of the p-channel transistor 434 is coupled to the high rail 418 while the drain of the n-channel transistor 436 is coupled to the low rail 422. Transistors 434 and 436 function to produce an intermediate control voltage for the gate of p-channel transistor 414 of the first inverter segment.

The gate of the n-channel transistor 416 of the first inverter segment is coupled to the random pulse train 150. The drain of each p-channel transistor 414 is coupled to the source of its associated n-channel transistor 416. This junction in turn supplies the logic input to the gates of the next inverter segment in the series. The drain/source junction of the last inverter segment produces modified random pulse train 150'. Pulses of modified random pulse train 150' will tend to exhibit faster and more complete transitions between the rail potentials, thus removing substantially all partial peaks.

One example of a random pulse generator 100 configured in accordance with the foregoing discussion includes a first oscillator 110$_A$ having the form as shown in FIG. 2C and having 9 inverter segments, a second oscillator 110$_B$ having the form as shown in FIG. 2D and having 15 inverter segments, and a third oscillator 110$_C$ having the form as shown in FIG. 2C and having 5 inverter segments. The filter 120 has the form as shown in FIG. 3. Random pulse train 150 is conditioned with a signal conditioner 415 as shown in FIG. 4B.

Figure 5:
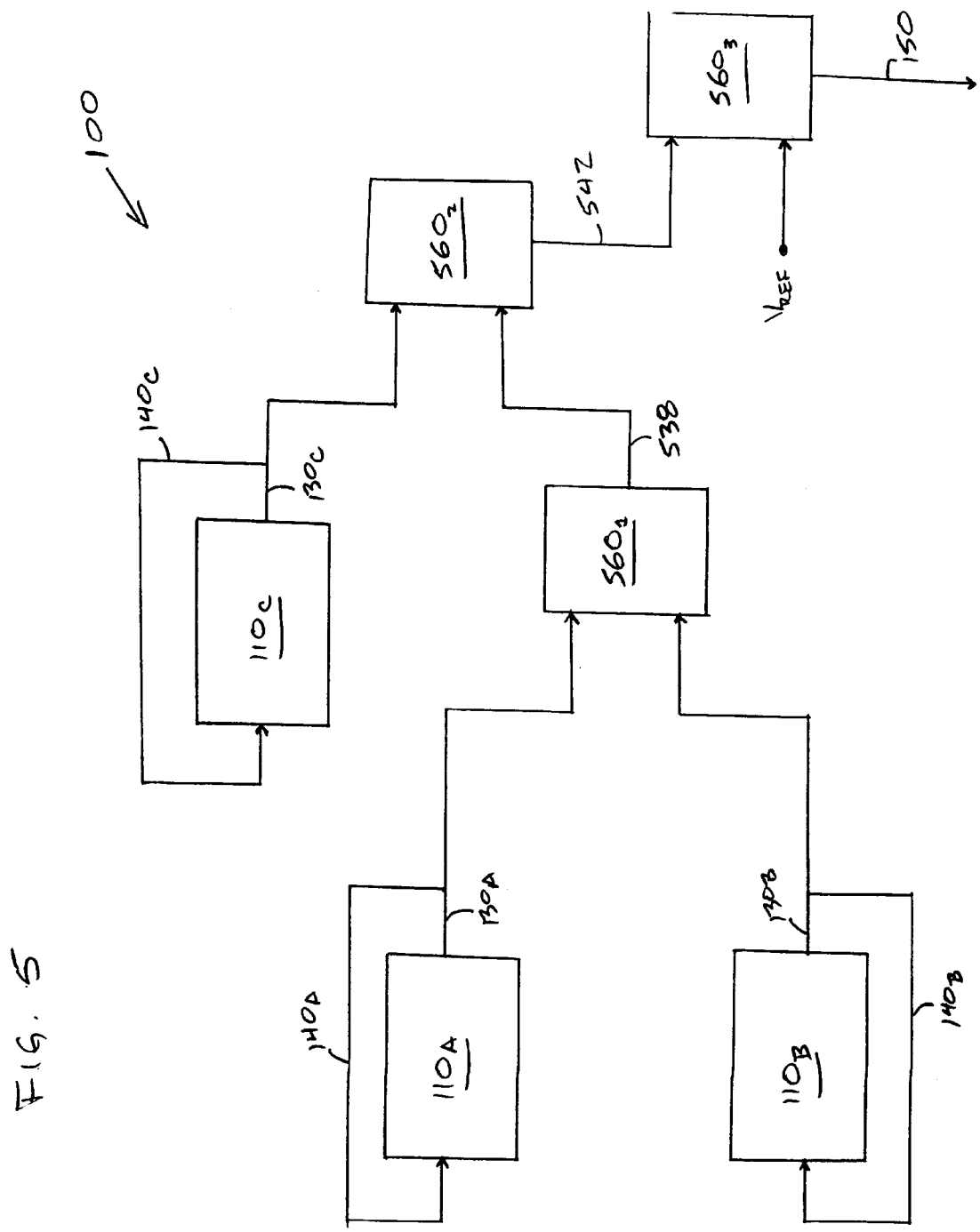
FIG. 5 is a block diagram of a random pulse generator.

FIG. 5 is a block diagram of another embodiment of a random pulse generator 100 in accordance with the invention. Random pulse generator 100 includes three oscillators 110$_A$, 110$_B$ and 110$_C$. The three oscillators 110 each have an output signal 130 that oscillates between a logic high level and a logic low level. Left undisturbed, the output signal 130 of each oscillator 110 will generally oscillate between the logic high level and the logic low level at a regular frequency having a period equal to the propagation time of an input signal through the oscillator 110, in this case feedback signal 140.

To reduce the risk of coupling among the oscillators 110, it is preferred that each oscillator 110 have a different period. It may further be desirable that each oscillator 110 have a period that is not a multiple of either of the other oscillators 110. However, neither of these guidelines is required. For one embodiment, the final oscillator 110$_C$ has the shortest period. As one example, oscillator 110$_A$ may have a period of 7t, oscillator 110$_B$ may have a period of 5t and oscillator 110$_C$ may have a period of 3t, where t is some measure of time.

Each oscillator 110 in FIG. 5 utilizes its output signal 130 as the feedback signal 140. The output signals 130$_A$ and 130$_B$ of oscillators 110$_A$ and 110$_B$, respectively, are coupled to subtractor 560, as first and second inputs. Subtractor 560$_1$ provides an output signal 538 representing an intermediate potential between the potential of output signal $130_A$ and the potential of output signal $130_B$. For one embodiment, the output signal 538 is the average of the potential of output signal $130_A$ and the potential of output signal $130_B$. The output signal 538 is coupled to subtractor $560_2$ with the output signal $130_C$ as first and second inputs. Subtractor $560_2$ provides an output signal 542 representing an intermediate potential between the potential of output signal $130_C$ and the potential of output signal 538. In this manner, the output signals $130_A$ and $130_B$ of oscillators $110_A$ and $110_B$, respectively, disturb the output signal $130_C$ of oscillator $110_C$ to produce output signal 542. For one embodiment, the output signal 542 is the average of the potential of output signal $130_C$ and the potential of output signal 538. The output signal 542 is coupled to subtractor $560_3$ with reference potential $V_{REF}$ as first and second inputs. Subtractor $560_3$ provides as its output signal random pulse train 150 representing an intermediate potential between the potential of output signal 542 and the reference potential $V_{REF}$. For one embodiment, the random pulse train 150 is the average of the potential of output signal 542 and the reference potential $V_{REF}$. With no intervening oscillators between oscillator $110_C$ and random pulse train 150, oscillator $110_C$ is referred to as the final oscillator.

It should be apparent that additional oscillators 110 could be coupled with additional subtractors in a cascaded fashion similar to FIG. 5, with two oscillators 110 feeding a first subtractor, a third oscillator 110 feeding a second subtractor with the output of the first subtractor, a fourth oscillator feeding a third subtractor with the output of the second subtractor, etc., with a final oscillator 110 feeding an $N^{th}$ subtractor with the combined output of the preceding cascaded oscillators. The combined output of the preceding cascaded oscillators is represented by the output of the $N^{th}-1$ subtractor. In such a manner, at least two oscillators 110 would disturb the output signal of the final oscillator 110.

FIG. 6 is a schematic of one embodiment of a subtractor 560 for producing an intermediate potential. The subtractor has a first n-channel transistor 644 having its source coupled to a supply voltage $V_s$ and a second n-channel transistor 646 having its drain coupled to a ground node. The gate of the first n-channel transistor 644 is coupled to a first input signal 648. The gate of the second n-channel transistor 646 is coupled to a second input signal 652. The drain of the first n-channel transistor 644 is coupled to the source of the second n-channel transistor 646. The drain/source junction of the transistors 644 and 646 produces the output signal 654 having a potential intermediate of, and substantially the average of, the supply voltage $V_s$ and ground. Other circuits for producing a potential intermediate of the potential of a first input signal and the potential of a second input signal are well within the skill in the art. Note, however, that producing an intermediate potential that is skewed to one side of the average of the two input potentials will tend to reduce the randomness of the resulting random pulse train.

Figure 7:
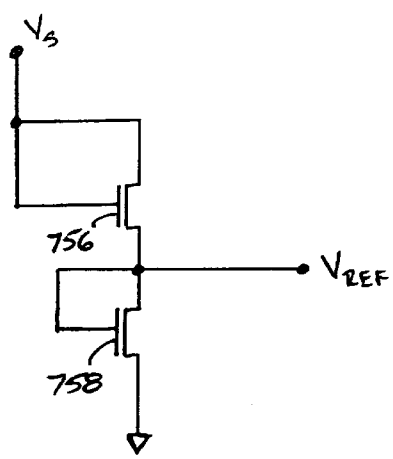
FIG. 7 is a schematic of a circuit for generating a reference voltage for use with a random pulse generator of FIG. 5.

The reference potential $V_{REF}$ for one embodiment is a potential level approximating the average of the high rail potential, or supply voltage, and the low rail potential, or ground. FIG. 7 is a schematic of a circuit for generating a reference potential $V_{REF}$ approximating the average of the supply voltage $V_s$ and ground. The reference voltage circuit has an n-channel transistor 756, having its source and gate coupled to the supply voltage $V_s$, and an n-channel transistor 758, having its drain coupled to a ground node. The drain of n-channel transistor 756 is further coupled to the source and gate of n-channel transistor 758. The drain/source junction between n-channel transistors 756 and 758 produces the reference voltage $V_{REF}$. Note that producing a reference voltage that is skewed to one side of the average of the supply voltage $V_s$ and ground will tend to reduce the randomness of the resulting random pulse train.

Random pulse train 150 of the random pulse generator 100 of FIG. 5 will generally contain pulses having values other than logic high (high rail potential) and logic low (low rail potential). Pulses having values other than logic high and logic low appear as partial peaks or "runt" pulses in the random pulse train 150. It may be desirable to condition the random pulse train 150 to remove such partial peaks using signal conditioners as described previously with reference to FIGS. 4A–4C.

One example of a random pulse generator 100 configured in accordance with the foregoing discussion includes a first oscillator $110_A$ having the form as shown in FIG. 2B and having 7 inverter segments, a second oscillator $110_B$ having the form as shown in FIG. 2B and having 5 inverter segments, and a third oscillator $110_C$ having the form as shown in FIG. 2B and having 3 inverter segments. Each subtractor 560 has the form as shown in FIG. 6. The reference voltage generating circuit has the form as shown in FIG. 7. Random pulse train 150 is conditioned with a signal conditioner 415 as shown in FIG. 4C.

FIG. 8 is a block diagram of one embodiment of a random pulse generating system 800 for adjusting the average transition rate of the random pulse train 150/150' (i.e., conditioned or unconditioned) of a random pulse generator 100, as described above with reference to FIGS. 1 and/or 5. The random pulse generating system 800 includes a random pulse generator 100 coupled in series with at least one frequency divider 870. Each frequency divider 870 provides a mechanism for reducing the average number of transitions of its respective input signal per unit time. For one embodiment, each frequency divider changes its output state when the input signal changes from low to high. In this manner, an on-off input waveform of rate R will generate an on-off output waveform of rate R/2. As one example, a frequency divider 870 may be constructed of two D-type flip-flops and an inverter. Other methods of reducing the average number of transitions per unit time are further within the skill in the art. The first frequency divider $870_1$ receives as its input random pulse train 150/150' from random pulse generator 100. Succeeding frequency dividers 870 receive as their input the frequency divider output signal 875 of the preceding frequency divider 870 in the series.

Outputs from the random pulse generator 100 (random pulse train 150/150') and the frequency dividers $870_1$–$870_n$ (frequency divider output signals $875_1$–$875_n$) are further coupled in parallel as inputs to a multiplexer 880. Control signal 885 is coupled to multiplexer 880 to select one of the multiplexer inputs as selected output 850. As an example, in a random pulse generating system 800 having a random pulse generator 100 and seven frequency dividers 870, a 3-bit binary control signal may be used to select one of the multiplexer inputs. Other selection methods are well within the skill of the art to select one multiplexer input as the selected output 850.

As depicted in FIG. 8, the output of each frequency divider 870 will represent a random pulse train having a transition rate of approximately ½ of the preceding frequency divider 870, or of the random pulse generator 100 in the case of frequency divider $870_1$. Through selection of the appropriate multiplexor input signal for output signal 850, output signal 850 will have an average transition rate ranging between the average transition rate of the random pulse train 150 and a rate approximately equal to ½$^N$ times the average transition rate of the random pulse train 150, where N equals the number of frequency dividers 870 in series.

Regardless of whether random pulse generator 100 includes a signal conditioner as described herein, selected output 850 may contain partial peaks. A signal conditioner 815 may be included in the pulse generating system 800 to substantially remove such partial peaks from the output of the pulse generating system 800. The previous discussion of signal conditioners for use with various embodiments of the invention is equally applicable to the signal conditioner 815. FIG. 9 is a symbolic schematic of a signal conditioner 815 showing that the output of the signal conditioner 815, i.e., modified output signal 850', need not represent the same logic level as the input to the signal conditioner 815, i.e., output signal 850. Signal conditioner 815 of FIG. 9 depicts a NAND gate having a high logic level as one input and output signal 850 as the second input, thus functioning as an inverter. The modified output signal 850' would thus have a logic level opposite of the output signal 850.

The various embodiments described herein are generally suited for fabrication as integrated circuits. It may be desirable to allow stray coupling of signals from adjacent circuitry into the phase shift oscillators to further improve the randomness of the resulting random pulse train by disturbing the oscillator's natural period of oscillation.

The embodiments described herein may be combined to produce additional random pulse generators 100. FIGS. 10A–10D depict just a few examples of random pulse generators 100 having at least three oscillators 110 such that the output signals 130 of at least two of the oscillators 110 are combined to disturb the output signal 130 of a final oscillator 110.

FIG. 10A depicts a random pulse generator 100 where the output signals 130$_{A/B}$ of two oscillators 110$_{A/B}$ are coupled to a subtractor 560. The output signal of the subtractor 560 is coupled to a filter 120. Filter 120 modifies the feedback signal 140$_C$ of the final oscillator 110$_C$, thus disturbing the output signal 130$_C$ of the final oscillator 110$_C$ to produce random pulse train 150. As can be seen in FIG. 10A, output signals 130$_{A/B}$ are combined to disturb the output signal 130$_C$.

FIG. 10B depicts a random pulse generator 100 where the output signals 130$_{A/B}$ of two oscillators 110$_{A/B}$ are coupled to a first subtractor 560$_1$. The output signal 538 of the first subtractor 560$_1$ is coupled to a second subtractor 560$_2$ with the feedback signal 140$_C$ of a final oscillator 110$_C$. Second subtractor 560$_2$ modifies the feedback signal 140$_C$ of the final oscillator 110$_C$, thus disturbing the output signal 130$_C$ of the final oscillator 110$_C$ to produce random pulse train 150. As can be seen in FIG. 10B, output signals 130$_{A/B}$ are combined to disturb the output signal 130$_C$.

FIG. 10C depicts a random pulse generator 100 where the output signals 130$_{A/B}$ of two oscillators 110$_{A/B}$ are coupled to a first subtractor 560$_1$. The output signal 538 of the first subtractor 560$_1$ is coupled to a second subtractor 560$_2$ with the output signal 130$_C$ of a third oscillator 110$_C$. The output signal 542 of the second subtractor 560$_2$ is coupled to a filter 120. Filter 120 modifies the feedback signal 140$_D$ of the final oscillator 110$_D$, thus disturbing the output signal 130$_D$ of the final oscillator 110$_D$ to produce random pulse train 150. As can be seen in FIG. 10C, output signals 130$_{A/B/C}$ are combined to disturb the output signal 130$_D$.

FIG. 10D depicts a random pulse generator 100 where the output signals 130$_{A/B}$ of two oscillators 110$_{A/B}$ are coupled to a filter 120. Filter 120 modifies the feedback signal 140$_C$ of a third oscillator 110$_C$, thus disturbing the output signal 130$_C$ of the third oscillator 110$_C$. The output signal 130$_C$ of the third oscillator 110$_C$ is coupled to a subtractor 560 with the output signal 130$_D$ of a final oscillator 110$_D$, thus disturbing the output signal 130$_D$ of the final oscillator 110$_D$ to produce random pulse train 150. As can be seen in FIG. 10D, output signals 130$_{A/B/C}$ are combined to disturb the output signal 130$_D$.

Other random pulse generators using various numbers of oscillators in combination with filters and/or subtractors will be apparent from the guidance as provided above. As with other embodiments, signal conditioning of the random pulse train may be utilized to substantially remove partial peaks.

Conclusion

Random pulse generators and generating systems have been described using at least three oscillators. The output signals of at least two of the oscillators are combined to disturb the output signal of a final oscillator. For one configuration, combined output signals of at least two phase shift oscillators are used to modify the feedback signal of a final phase shift oscillator, thus disturbing the output signal of the final oscillator. For another configuration, the output signals of at least two phase shift oscillators are used to drive a subtractor whose output signal is combined with the output signal of a final phase shift oscillator to drive a subsequent subtractor, thus disturbing the output signal of the final oscillator.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. For example, other configurations of phase shift oscillators may be used. In addition, oscillators having phase shifts of other than 180° may be used, e.g., phase shifts of 45°, 90°, 120°, etc. Furthermore, additional oscillators can be coupled in the random pulse generators of the various embodiments in accordance with the guidance as noted above. Accordingly, this application is intended to cover any adaptations or variations of the invention. It is manifestly intended that this invention be limited only by the following claims and the equivalents thereof.

What is claimed is:

1. A random pulse generator, comprising:
   a first oscillator having an output signal;
   a second oscillator having an output signal;
   a third oscillator having an output signal and a feedback signal coupled to an input of the third oscillator; and
   a signal conditioner coupled to the output signal of the third oscillator and adapted to substantially remove partial peaks from the output signal of the third oscillator;
      wherein the output signal of the first oscillator and the output signal of the second oscillator are combined to disturb the output signal of the third oscillator to provide the feedback signal.

2. The random pulse generator of claim 1, wherein each oscillator is a phase shift oscillator.

3. The random pulse generator of claim 1, wherein each oscillator has a natural period of oscillation and the natural period of oscillation of each oscillator differs from the natural period of oscillation of the other oscillators.

4. A random pulse generator, comprising:
a first oscillator having an output signal;
a second oscillator having an output signal;
a third oscillator having an output signal; and
a signal conditioner coupled to the output signal of the third oscillator and adapted to substantially remove partial peaks from the output of the third oscillator;
wherein the output signal of the first oscillator and the output signal of the second oscillator are combined to disturb the output signal of the third oscillator,
the random pulse generator further comprising at least one additional oscillator having an output signal, wherein each output signal of each at least one additional oscillator is combined with the output signals of the first and second oscillators to disturb the output signal of the third oscillator.

5. A random pulse generator, comprising:
a first oscillator having an output signal;
a second oscillator having an output signal; and
a third oscillator having an output signal;
wherein the output signal of the first oscillator and the output signal of the second oscillator are combined to disturb the output signal of the third oscillator, the random pulse generator further comprising a filter, wherein the output signal of the first oscillator and the output signal of the second oscillator are combined to produce a variable resistance of the filter, and a feedback signal of the third oscillator coupled to the filter is modified by the variable resistance of the filter.

6. A random pulse generator, comprising:
a first oscillator having an output signal;
a second oscillator having an output signal; and
a third oscillator having an output signal;
wherein the output signal of the first oscillator and the output signal of the second oscillator are combined to disturb the output signal of the third oscillator, the random pulse generator further comprising a first subtractor and a second subtractor, wherein the output signal of the first oscillator and the output signal of the second oscillator are coupled to the first subtractor to produce a first subtractor output signal, and the output signal of the third oscillator and the first subtractor output signal are coupled to the second subtractor to produce a second subtractor output signal.

7. The random pulse generator of claim 5, further comprising a signal conditioner coupled to the output signal of the third oscillator and adapted to substantially remove partial peaks from the output signal of the third oscillator.

8. The random pulse generator of claim 6, further comprising a third subtractor, wherein the second subtractor output signal and a reference voltage are coupled to the third subtractor to produce a third subtractor output signal.

9. The random pulse generator of claim 8, further comprising a signal conditioner coupled to the third subtractor output signal and adapted to substantially remove partial peaks from the third subtractor output signal.

10. A random pulse generator, comprising:
a first oscillator having an output signal;
a second oscillator having an output signal; and
a third oscillator having an output signal;
wherein the output signal of the first oscillator and the output signal of the second oscillator are combined to disturb the output signal of the third oscillator to provide a feedback signal, wherein at least one oscillator comprises a series of inverter segments.

11. The random pulse generator of claim 10, where in at least one oscillator further comprises a diode-connected transistor interposed between each inverter segment and a rail potential, thereby limiting a range of output voltage of the oscillator.

12. A random pulse generator, comprising:
a first phase shift oscillator having an output signal and a feedback signal and comprising a first odd number of inverter segments;
a second phase shift oscillator having an output signal and a feedback signal and comprising a second odd number of inverter segments;
a third phase shift oscillator having an output signal and a feedback signal and comprising a third odd number of inverter segments; and
a filter comprising a resistive component and having a first input of the output signal of the first phase shift oscillator, a second input of the output signal of the second phase shift oscillator, and a third input of the feedback signal of the third phase shift oscillator;
wherein the output signal of the first phase shift oscillator and the output signal of the second phase shift oscillator vary a resistance of the resistive component of the filter; and
wherein the feedback signal of the third phase shift oscillator is coupled to the resistive component of the filter and is modified by varying the resistance of the resistive component of the filter.

13. The random pulse generator of claim 12, further comprising at least one additional phase shift oscillator having an output signal, wherein each output signal of each at least one additional phase shift oscillator is combined with the output signals of the first and second phase shift oscillators to vary the resistance of the resistive component of the filter.

14. The random pulse generator of claim 12, wherein each phase shift oscillator has a natural period of oscillation and the natural period of oscillation of each phase shift oscillator differs from the natural period of oscillation of the other phase shift oscillators.

15. The random pulse generator of claim 12, further comprising a signal conditioner coupled to the output signal of the third phase shift oscillator and adapted to substantially remove partial peaks from the output signal of the third phase shift oscillator.

16. The random pulse generator of claim 12, wherein at least one phase shift oscillator further comprises a diode-connected transistor interposed between each inverter segment and a rail potential, thereby limiting a range of output voltage of the at least one phase shift oscillator.

17. The random pulse generator of claim 12, wherein the first odd number of inverter segments is not equal to each of the second and third odd number of inverter segments, and the second odd number of inverter segments is further not equal to the third odd number of inverter segments.

18. The random pulse generator of claim 12, wherein the third odd number of inverter segments is less than each of the first and second odd number of inverter segments.

19. A random pulse generator, comprising:
a first phase shift oscillator having an output signal and a feedback signal and comprising
a first odd number of inverter segments;
a second phase shift oscillator having an output signal and a feedback signal and comprising a second odd number of inverter segments;

a third phase shift oscillator having an output signal and a feedback signal and comprising a third odd number of inverter segments;

a first subtractor coupled to the output signals of the first and second phase shift oscillators, wherein the first subtractor produces a first intermediate potential in response to the output signals of the first and second phase shift oscillators; and a second subtractor coupled to the first intermediate potential and the output signal of the third phase shift oscillator, wherein the second subtractor produces a second intermediate potential in response to the first intermediate potential and the output signal of the third phase shift oscillator.

20. The random pulse generator of claim 19, further comprising a third subtractor coupled to the second intermediate potential and a reference voltage, wherein the third subtractor produces a third intermediate potential in response to the second intermediate potential and the reference voltage.

21. The random pulse generator of claim 20, further comprising a signal conditioner coupled to the third intermediate potential and adapted to substantially remove partial peaks from the third intermediate potential.

22. The random pulse generator of claim 19, wherein at least one phase shift oscillator further comprises a diode-connected transistor interposed between each inverter segment and a rail potential, thereby limiting a range of output voltage of the phase shift oscillator.

23. The random pulse generator of claim 19, wherein the first odd number of inverter segments is not equal to each of the second and third odd number of inverter segments, and the second odd number of inverter segments is further not equal to the third odd number of inverter segments.

24. The random pulse generator of claim 19, wherein the third odd number of inverter segments is less than each of the first and second odd number of inverter segments.

25. A random pulse generator, comprising:

a plurality of first phase shift oscillators having a combined output signal;

a second phase shift oscillator having an output signal and a feedback signal;

a third phase shift oscillator having an output signal and a feedback signal;

a first subtractor coupled to the combined output signal of the plurality of first phase shift oscillators and the output signal of the second phase shift oscillator, wherein the first subtractor produces a first intermediate potential in response to the combined output signal of the plurality of first phase shift oscillators and the output signal of the second phase shift oscillator; and a second subtractor coupled to the first intermediate potential and the output signal of the third phase shift oscillator, wherein the second subtractor produces a second intermediate potential in response to the first intermediate potential and the output signal of the third phase shift oscillator.

26. The random pulse generator of claim 25, wherein the plurality of first phase shift oscillators comprises a cascade of phase shift oscillators and subtractors.

27. A random pulse generating system, comprising:

a random pulse generator having a random pulse train, wherein the random pulse generator comprises:
 a first oscillator having an output signal;
 a second oscillator having an output signal; and
 a third oscillator having an output signal;
 wherein the output signal of the first oscillator and the output signal of the second oscillator are combined to disturb the output signal of the third oscillator; and
 wherein the random pulse train is responsive to the output signal of the third oscillator;

at least one frequency divider each having an input signal and an output signal, wherein the at least one frequency divider is coupled to the random pulse generator in series, a first frequency divider in the series has the random pulse train as its input signal, and each succeeding frequency divider in the series has the output signal of the preceding frequency divider as its input signal; and a multiplexor coupled to the random pulse train and the output signals of the at least one frequency divider as parallel inputs, wherein the multiplexor is responsive to a control signal to select one of the parallel inputs as a selected output.

28. The random pulse generating system of claim 27, further comprising a signal conditioner coupled to the selected output and adapted to substantially remove partial peaks from the selected output.

29. A method of generating a random pulse train, comprising:

producing a first output signal from a first oscillator;

producing a second output signal from a second oscillator;

combining the first output signal and the second output signal to disturb an output signal of a third oscillator wherein the disturbed output signal is coupled to an input of the third oscillator as a feedback signal; and conditioning the output signal of the third oscillator to substantially remove partial peaks from the output signal of the third oscillator.

30. A method of generating a random pulse train, comprising:

producing a first output signal from a first oscillator;

producing a second output signal from a second oscillator; and combining the first output signal and the second output signal to disturb an output signal of a third oscillator, and further comprising:

producing at least one additional output signal from at least one additional oscillator;

combining the at least one additional output signal with the first and second output signals to disturb the output signal of the third oscillator; and conditioning the output signal of the third oscillator to substantially remove partial peaks from the output signal of the third oscillator.

31. A method of generating a random pulse train, comprising:

producing a first output signal from a first oscillator;

producing a second output signal from a second oscillator; and combining the first output signal and the second output signal to disturb an output signal of a third oscillator, wherein combining the first output signal and the second output signal to disturb an output signal of a third oscillator comprises varying a resistance in response to the first and second output signals and modifying a feedback signal of the third oscillator in response to the resistance.

32. A method of generating a random pulse train, comprising:

producing a first output signal from a first oscillator;

producing a second output signal from a second oscillator; and combining the first output signal and the second output signal to disturb an output signal of a third oscillator, wherein combining the first output signal and the second output signal to disturb an output signal of a third oscillator comprises producing a first intermediate potential in response to the first output signal and the second output signal, and producing a second intermediate potential in response to the output signal of the third oscillator and the first intermediate potential.

33. The method of claim 31, further comprising conditioning the output signal of the third oscillator to substantially remove partial peaks from the output signal of the third oscillator.

34. The method of claim 32, further comprising producing a third intermediate potential in response to the second intermediate potential and a reference voltage, and conditioning the third intermediate potential to substantially remove partial peaks from the third intermediate potential.

35. A method of generating a random pulse train, comprising:

producing a first output signal from a first oscillator;

producing a second output signal from a second oscillator; and varying a resistance in response to the first and second output signals;

modifying a feedback signal of a third oscillator in response to the resistance, thereby disturbing an output signal from the third oscillator;

conditioning the output signal from the third oscillator to substantially remove partial peaks from the output signal from the third oscillator.

36. A method of generating a random pulse train, comprising:

producing a first output signal from a first oscillator;

producing a second output signal from a second oscillator;

producing a first intermediate potential in response to the first output signal and the second output signal;

producing a second intermediate potential in response to the output signal of the third oscillator and the first intermediate potential;

producing a third intermediate potential in response to the second intermediate potential and a reference voltage; and conditioning the third intermediate potential to substantially remove partial peaks from the third intermediate potential.

* * * * *

UNITED STATES PATENT AND TRADEMARK OFFICE
CERTIFICATE OF CORRECTION

PATENT NO.     : 6,522,210 B1
DATED          : February 18, 2003
INVENTOR(S)    : Paul E. Bauhahn and Mark D. Dvorak It is certified that error appears in the above-identified patent and that said Letters Patent is hereby corrected as shown below:

Column 1,
Lines 3-6, delete the following:
"The Present invention was produced in conjunction with research for the Office of Naval Research under Contract No. N00014-98-3-0020. The United States Government has certain rights to the invention."
Line 15, insert the following paragraph after "oscillator";
-- The Present invention was produced in conjunction with research for the Office of Naval Research under Contract No. N00014-98-3-0020. The United States Government has certain rights to the invention. --

Column 8,
Line 66, delete "560" before "as first" and insert -- 5601 -- therefor.

Column 13,
Line 4, delete "having an output signal" after "third oscillator".
Line 7, insert -- signal -- after "output".

Signed and Sealed this

Nineteenth Day of August, 2003

JAMES E. ROGAN
*Director of the United States Patent and Trademark Office*